United States Patent
Carruthers et al.

(10) Patent No.: US 7,517,795 B2
(45) Date of Patent: Apr. 14, 2009

(54) STABILIZATION OF NI MONOSILICIDE THIN FILMS IN CMOS DEVICES USING IMPLANTATION OF IONS BEFORE SILICIDATION

(75) Inventors: Roy A. Carruthers, Stormville, NY (US); Cedrik Y. Cole, Montreal (CA); Christophe Detavernier, Denderleeuw (BE); Christian Lavoie, Ossining, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 11/551,647

(22) Filed: Oct. 20, 2006

(65) Prior Publication Data

US 2007/0042586 A1  Feb. 22, 2007

Related U.S. Application Data

(62) Division of application No. 10/838,377, filed on May 4, 2004, now Pat. No. 7,119,012.

(51) Int. Cl.
    *H01L 21/44* (2006.01)
(52) U.S. Cl. ............ 438/664; 438/663; 438/682; 438/683; 257/E21.002
(58) Field of Classification Search ............ 438/660, 438/663, 664, 682, 683
    See application file for complete search history.

(56) References Cited

U.S. PATENT DOCUMENTS

| 5,940,699 | A | 8/1999 | Sumi et al. |
| 6,083,817 | A | 7/2000 | Nogami et al. |
| 6,191,463 | B1 * | 2/2001 | Mitani et al. ........... 257/411 |
| 6,261,889 | B1 | 7/2001 | Ono et al. |
| 6,436,783 | B1 | 8/2002 | Ono et al. |
| 6,740,570 | B2 * | 5/2004 | Chen et al. ............. 438/528 |
| 7,015,107 | B2 | 3/2006 | Sugihara et al. |
| 2001/0045605 | A1 | 11/2001 | Miyashita et al. |

OTHER PUBLICATIONS

Wong et al. "F-Enhanced Morphological and Thermal Stability of NiSi Films on BF+2-Implanted Si(001)," Appl. Phys. Let., Dec. 30, 2002, 5138-5140, vol. 81, No. 27.

* cited by examiner

*Primary Examiner*—Zandra V. Smith
*Assistant Examiner*—Christy L Novacek
(74) *Attorney, Agent, or Firm*—Scully, Scott, Murphy & Presser, P.C.; Robert M. Trepp, Esq.

(57) ABSTRACT

A method for forming a stabilized metal silicide film, e.g., contact (source/drain or gate), that does not substantially agglomerate during subsequent thermal treatments, is provided In the present invention, ions that are capable of attaching to defects within the Si-containing layer are implanted into the Si-containing layer prior to formation of metal silicide. The implanted ions stabilize the film, because the implants were found to substantially prevent agglomeration or at least delay agglomeration to much higher temperatures than in cases in which no implants were used.

1 Claim, 6 Drawing Sheets

STABILIZATION OF NI MONOSILICIDE THIN FILMS IN CMOS DEVICES USING IMPLANTATION OF IONS BEFORE SILICIDATION

RELATED APPLICATIONS

This application is a divisional of U.S. application Ser. No. 10/838,377, filed May 4, 2004.

FIELD OF THE INVENTION

The present invention relates to metal silicide films for complementary metal oxide semiconductor (CMOS) devices, and more particularly to a method of fabricating metal silicide films that exhibit little or no agglomeration during subsequent thermal processing.

BACKGROUND OF THE INVENTION

Current CMOS technology uses silicides as contacts to the source/drain (S/D) regions of the devices that are fabricated upon a Si-containing substrate. Examples of silicides with low resistivity and contact resistance that are currently being used as S/D contacts are the C54 phase of $TiSi_2$, $CoSi_2$, and NiSi. All three of these silicides are integrated using a self-aligned silicide process (i.e., a salicide process). This process consists of a blanket deposition of the metal (Ti, Co, or Ni) with a cap layer (such as TiN, Ti or W), annealing at a first lower temperature to form a first silicide phase (i.e., the C49 phase of TiSi, CoSi, or NiSi), selectively wet etching the cap layer and unreacted metal that is not in contact with silicon, and annealing at a second higher temperature to form the low resistance metal silicide phase (the C54 phase of $TiSi_2$ or $CoSi_2$). For the low resistance NiSi, the second anneal is typically not needed.

The advantage of these particular silicides is that they all may be implemented with the self-aligned process avoiding additional lithographic steps. One advantage of Ni silicides is that Ni monosilicide contacts are thinner than conventional Ti or Co silicide contacts. A disadvantage of Ni silicide contacts is that the higher resistivity nickel disilicide phase is produced during high temperature processing steps, rather than the preferred lower resistivity nickel monosilicide, NiSi, phase. The formation of the nickel disilicide phase is nucleation controlled. A disadvantage of forming nickel disilicides is that it consumes twice the amount of Si than the preferred NiSi phase. Moreover, nickel disilicides produce a rougher silicide/Si wafer interface and also have a higher sheet resistivity than the preferred NiSi.

Another disadvantage of NiSi contacts is that they tend to agglomerate readily at standard CMOS processing temperatures. The term "agglomerate" is used herein to denote that a very thin film of NiSi tends to gather into a mass or cluster at temperatures on the order of about 400° C. or higher. The agglomeration problem is not limited to Ni silicides. It typically occurs for various thin films other than NiSi and is worst for low melting point materials. Pt silicide is one example of another silicide that tends to agglomerate readily.

Preventing agglomeration is a key to getting the NiSi process to yield adequately. Attempts have been made in the prior art to develop methods for preventing the agglomeration of NiSi. Most of these prior art approaches use a binary or ternary Ni alloy. The alloy may be contained within the metal layer itself, or it can be formed atop the metal layer such that during annealing diffusion and intermixing of alloy, metal and Si occurs. These alloys, however, require much addition work to define the alloy concentrations and to develop adequate post silicide formation etches.

In addition to the use of Ni alloys, there have been some fairly recent publications that have shown that $BF_2$ implants to form pFET regions can enhance NiSi formation compared with the nFET regions in which $BF_2$ was not implanted. See, for example, A. S. Wong, et al., Appl. Phys. Lett. 81, 5138 (2002); S. K. Donthu, et al., Mater. Res. Soc. Symp. Proc. 716, 465 (2002); and C. Lavoie, et al., Microelectronic Engineering 70 (2003) 144-157. While these three publications show an improvement in the NiSi in $BF_2$ implanted regions they do not disclose the purposeful implantation of F or other like ions into both n and p regions to stabilize NiSi formation and prevent agglomeration of NiSi. Implantation of $BF_2$ requires activation anneal for the B. Moreover, $BF_2$ implantation does not fix the agglomeration problem on nFETs.

In view of the above, there is a need for providing a new and improved method to fabricate metal silicide films, e.g., NiSi films, that show little or no agglomeration upon further heat treatments.

SUMMARY OF THE INVENTION

The present invention provides a method for forming a stabilized metal silicide film, e.g., contact (source/drain or gate), that does not substantially agglomerate during subsequent thermal treatments. In the present invention, ions are implanted into a Si-containing layer prior to formation of the metal silicide. The ions employed in the present invention are capable of attaching to defects within a Si-containing layer thereby preventing the metal used in formation of the silicide from substantially diffusing into the Si-containing layer. In some embodiments, depending on the conditions of the implant, the ions can amorphize or partially amorphize a region in the Si-containing layer. Moreover, the ions employed in the present invention substantially prevent agglomeration, or at least delaying agglomeration to much higher temperatures than in cases in which no implants were used. Note that the ions used to prevent agglomeration are implanted into the structure following typical device ion implantation and activation annealing. Preventing agglomeration is key to getting the metal silicide process to yield adequately.

In broad terms, the present invention provides a method of forming a stabilized metal silicide film, e.g., contact, which includes the steps of implanting ions, after device ion implantation and activation annealing, that are capable of preventing agglomeration into a surface of a Si-containing layer; forming a metal layer atop the surface of the Si-containing layer containing the ions; and siliciding the metal layer and the Si-containing layer containing the ions to form a metal silicide film. In accordance with the present invention, the metal silicide film formed by the aforementioned processing steps exhibits little or no agglomeration during subsequent thermal processing.

In some embodiments, a cap layer is formed atop the metal layer prior to silicidation. The silicidation process step includes a first anneal, removal of the optional cap and unreacted metal layer and, if needed, a second anneal. The second anneal is not typically needed for all silicide formation, but can be used in instances in which a metal rich phase is formed during the first anneal.

The method of the present invention described above can be used to form metal silicide contacts of low resistivity atop source/drain diffusion regions and/or gate conductors of a CMOS device.

The implantation can occur during the implantation of the source/drain diffusion regions or in a separate step prior to metal deposition.

The method of the present invention provides a faster alternative solution to the binary or ternary metal alloy approach of the prior art without the need to define alloy concentration or to develop new post silicide formation etches.

BRIEF DESCRIPTION OF THE DRAWINGS

FIG. 5A shows the sheet resistance data of NiSi on a blanket SOI layer using $F^+$ implants at 5 keV; FIG. 5B shows the sheet resistance data of NiSi on a blanket SOI layer using $F^+$ implants at 5 keV plus annealing at 1000° C., 5 seconds.

DETAIL DESCRIPTION OF THE INVENTION

Figure 1:
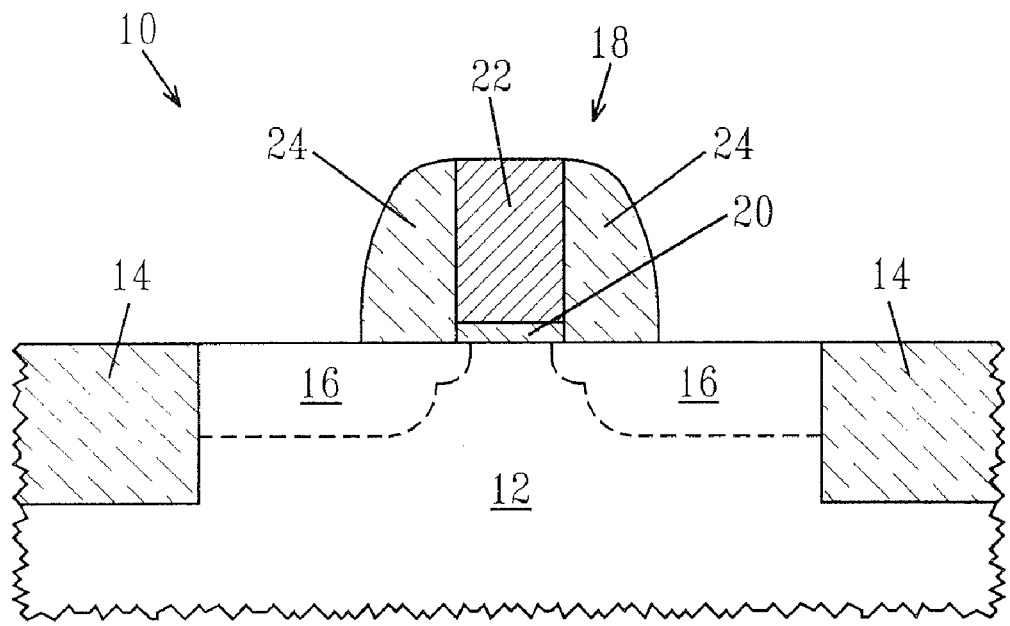
FIG. 1 is a pictorial representation (through a cross sectional view) of an initial structure that is employed in the present invention.

The present invention, which provides a method of forming a stabilized metal silicide film using implantation of ions after device ion implantation and activation annealing, but before silicidation, will now be described in greater detail by referring to the drawings that accompany the present application. The drawings, illustrate the formation of stabilized metal silicide contacts atop source/drain regions that are formed into a Si-containing substrate that has at least one CMOS device located thereon. Although such an illustration is shown, the present invention can be used to form a metal silicide film on any exposed Si-containing surface layer. The Si-containing surface layer may comprise any Si-containing semiconductor material, or it may comprise a polysilicon layer or a SiGe layer that may be used as a gate electrode of a CMOS device.

It should be noted that in the drawings that follow more than one CMOS device, i.e., transistor, can be formed atop the Si-containing substrate. Also, if the gate electrode is polysilicon or SiGe and there is no hardmask located thereon, a metal silicide contact, in accordance with the present invention, could be formed atop the gate electrode as well.

FIG. 1 shows an initial structure 10 that can be employed in the present invention. Specifically, the initial structure 10 shown in FIG. 1 comprises a Si-containing substrate (or layer) 12 having isolation regions 14 and source/drain diffusion regions 16 formed therein. The initial structure 10 of the present invention also includes a least one gate region 18 that includes a gate dielectric 20 and a gate conductor 22, located on top of the Si-containing substrate 12. An optional hardmask, not shown, can be located atop the gate conductor 22. In the embodiment shown, the gate region 18 also includes at least one spacer 24 located on each sidewall thereof.

The Si-containing substrate (or layer) 12 of the initial structure 10 shown in FIG. 1 comprises any silicon-containing semiconductor material including, but not limited to: Si, SiGe, SiGeC, SiC, Si/SiGe, preformed silicon-on-insulator (SOI) substrates, silicon germanium-on-insulator and other like semiconductor materials. The Si-containing semiconductor substrate (or layer) 12 may be doped, undoped or contain doped and undoped regions therein.

The isolation regions 14 are typically formed first into the Si-containing substrate 12. The isolation regions 14 can be trench isolation regions, as shown, or field oxide isolation regions. The trench isolation regions are formed utilizing a conventional trench isolation process well known to those skilled in the art. For example, lithography, etching and filling of the trench with a trench dielectric may be used in forming the trench isolation regions. Optionally, a liner may be formed in the trench prior to trench fill, a densification step may be performed after the trench fill and a planarization process may follow the trench fill as well. The field oxide regions may be formed utilizing a so-called local oxidation of silicon process.

After forming the isolation regions 14 within the Si-containing substrate 12, gate dielectric 20 is formed on the entire surface of the Si-containing substrate 12 including atop the isolation regions 14, if it is a deposited dielectric. The gate dielectric 20 can be formed by a thermal growing process such as, for example, oxidation, nitridation or oxynitridation. Alternatively, the gate dielectric 20 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 20 may also be formed utilizing any combination of the above processes.

The gate dielectric 20 is comprised of an insulating material including, but not limited to: an oxide, nitride, oxynitride and/or silicate. In one embodiment, it is preferred that the gate dielectric 20 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof, including the addition of silicon and nitrogen.

The physical thickness of the gate dielectric 20 may vary, but typically, the gate dielectric 20 has a thickness from about 0.5 to about 10 nm, with a thickness from about 0.5 to about 3 nm being more typical.

After forming the gate dielectric 20, a blanket layer of a gate electrode material 22 is formed on the gate dielectric 20 utilizing a known deposition process such as physical vapor deposition (PVD), CVD or evaporation. The gate electrode material 22 may comprise polysilicon, SiGe, a silicide or a metal. Preferably, the gate electrode 22 is comprised of polySi. Examples of metals that can be used as the gate electrode 22 include, but are not limited to: Al, W, Cu, Ti or other like conductive metals. The blanket layer of gate electrode material 22 may be doped or undoped. If doped, an in-situ doping deposition process may be employed. Alternatively, a doped gate electrode 22 can be formed by deposition, ion implantation and annealing.

The doping of the gate electrode 22 will shift the workfunction of the gate formed. Illustrative examples of doping ions include As, P, B, Sb, Bi, In, Al, Ti, Ga or mixtures thereof. The thickness, i.e., height, of the gate electrode material 22 deposited at this point of the present invention may vary depending on the deposition process employed. Typically, the gate electrode material 22 has a vertical thickness from about 20 to about 180 nm, with a thickness from about 40 to about 150 nm being more typical.

In some embodiments, an optional hardmask (not shown) may be formed atop the gate electrode material 22 by utilizing a conventional deposition process. The optional hardmask can be comprised of a dielectric such as an oxide or nitride.

The blanket gate electrode material 22 (and optionally the gate dielectric 20) is typically, but not always, patterned by lithography and etching so as to provide at least one gate region 18. Each gate region 18 formed may have the same dimension, i.e., length, or they can have variable dimensions to improve device performance. The lithography step includes applying a photoresist to the upper surface of the blanket deposited gate electrode material 22, exposing the photoresist to a desired pattern of radiation and developing the exposed photoresist utilizing a conventional resist developer. The pattern in the photoresist is then transferred to the blanket layer of gate electrode material 22 utilizing a dry etching process. The patterned photoresist is removed after etching has been completed. In some embodiments, a hardmask may be formed prior to formation of the photoresist and used in patterning the blanket layer of gate electrode material 22.

Suitable dry etching processes that can be used in the present invention in forming the gate region 18 include, but are not limited to: reactive ion etching, ion beam etching, plasma etching or laser ablation. The dry etching process employed is typically selective to the underlying gate dielectric 20 therefore this etching step does not typically remove the gate dielectric 20. In some embodiments, this etching step may however be used to remove portions of the gate dielectric 20 that are not protected by the patterned gate region 18. The latter embodiment is depicted in the drawings of the present application.

Next, at least one spacer 24 is formed on exposed sidewalls of each gate region 18. The at least one spacer 24 is comprised of an insulator such as an oxide, nitride, oxynitride and/or any combination thereof. The at least one spacer 24 is formed by deposition and etching.

In addition to the one spacer 24, the present invention also contemplates a structure including multiple spacers. In particular, the present invention contemplates a structure including a first spacer having a first width and a second spacer having a second width wherein the first width is narrower than the second width.

The width of the spacer must be sufficiently wide enough such that the source/drain silicide contacts (to be subsequently formed) do not encroach underneath the edges of the gate electrode 22 into the channel region of the transistor. Typically, the source/drain silicide contacts do not encroach underneath the edges of the gate stack when the spacer has a width, as measured at the bottom, from about 20 to about 80 nm.

After spacer formation, source/drain diffusion regions 16 are formed into the substrate. Note that the source/drain diffusion regions 16 include extension regions that are typically formed prior to spacer formation. The extensions are formed by ion implantation and annealing. The annealing step may be omitted and performed during activation, i.e., annealing, of the source/drain diffusion regions 16. By combining both activations in a single anneal, the thermal budget of the overall process can be lowered. The source/drain diffusion regions 16 are formed utilizing ion implantation and an annealing step. The annealing step serves to activate the dopants that were implanted by the previous implant step(s). The conditions for the ion implantation and annealing are well known to those skilled in the art.

Next, and if not previously removed, the exposed portion of the gate dielectric 20 is removed utilizing a chemical etching process that selectively removes the gate dielectric 20. This etching step stops on an upper surface of the Si-containing substrate 12 as well as an upper surface of the isolation regions 14. Although any chemical etchant may be used in removing the exposed portions of the gate dielectric 20, in one embodiment dilute hydrofluoric acid (DHF) is used.

The above processing steps describe one technique that can be employed in the present invention for forming gate region 18. Another technique that can be employed is a damascene process in which a dummy gate region is first formed on the structure. After dummy gate formation, a planarizing dielectric material such as, for example, an oxide, is deposited and thereafter the structure is planarized to expose an upper surface of the dummy gate region. The dummy gate region is then selectively removed and gate region 18 is formed in the opening in which the dummy gate region was previously located. After formation of the gate region 18, the planarizing dielectric is etched back utilizing a conventional etching process.

Figure 2:
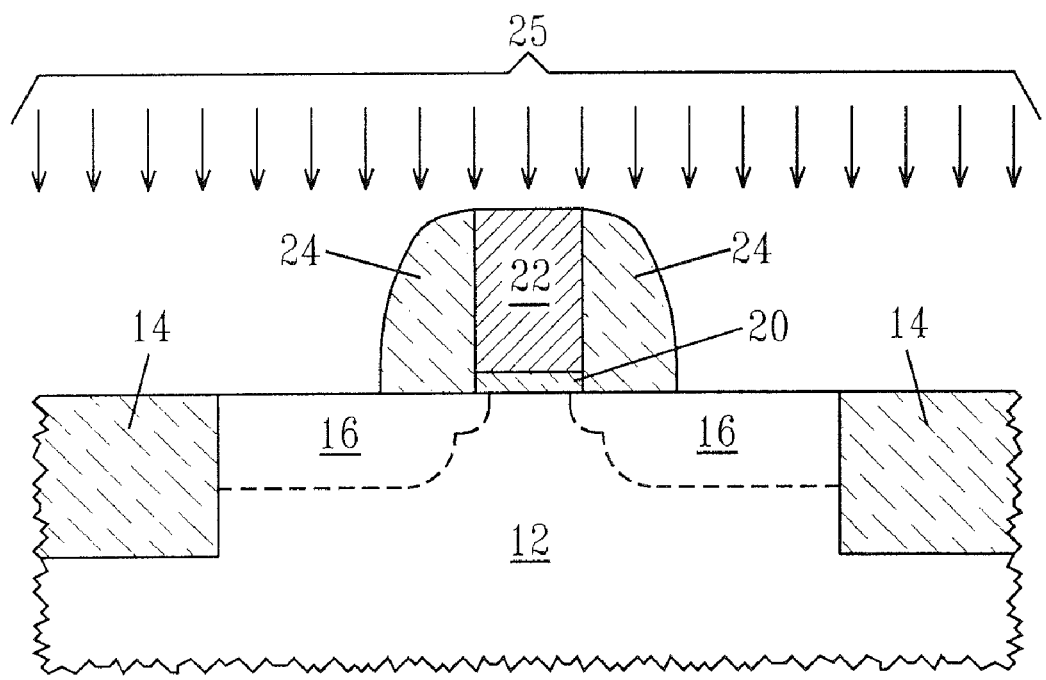
FIG. 2 is a pictorial representation (through a cross sectional view) illustrating the structure of FIG. 1 during implantation of ions.

Next, and as shown in FIG. 2, ions 25 are implanted into the Si-containing substrate 12. This ion implantation step may occur either during the above mentioned implantation step (with the implantation of source/drain dopants), or it can be performed as a separate step prior to silicidation, as shown here. The ion implantation process may be a blanket ion implant, such as is shown in FIG. 2. Alternatively, a selective implantation process can be employed wherein a patterned mask, not shown, is used to implant the ions only into the source/drain regions 16. Alternatively, a mask can be used that allows for different ions and/or ion concentration to be implanted. The ions are implanted using a conventional ion beam implanter that operates at standard conditions. When a blanket implantation is employed, ions 25 can also be implanted into the gate electrode so as to alter the workfunction thereof.

The ions are typically implanted at an energy from about 0.5 to about 5 keV using an ion dose from about 5E13 to about 5E15 atoms/$cm^2$. More typically, the ions are implanted at an energy from about 1 to about 2 keV using an ion dose from about 3E14 to about 3E15 atoms/$cm^2$. The implant is typically performed at a substrate temperature from about room temperature to about 200° C., with a substrate temperature of about room temperature being more typical. Note that the ion dose may vary depending on the specific ion being implanted.

The energy selected for the implantation of ions is such that most of the ion implants remains in the part of the Si-containing substrate 12 that will be consumed during the silicidation process.

In some embodiments of the present invention, the implanted ions are annealed in an inert gas ambient such as He, Ar, $N_2$, Xe or mixtures thereof. This annealing is typically performed at a temperature from about 200° C. to about 1200° C. This annealing step is optional and does not need to be performed in all instances to obtain a stabilized metal silicide that exhibits substantially no agglomeration. The annealing of the ions can be performed in some cases wherein the ions are implanted at a dose of about 1E15 atoms/$cm^2$ or greater.

The ions employed in the present invention are any ions that are capable of affecting the microstructure of the Si-containing layer by attaching to defects within a Si-containing layer thereby preventing the metal used in formation of the silicide from substantially diffusing into the Si-containing layer. In some embodiments depending on implant conditions, the implanted ions can form an amorphized or partially amorphized region in the Si-containing layer. Moreover, the ions employed in the present invention typically stabilize the metal silicide, because they substantially prevent agglomeration, or at least delay agglomeration to much higher temperatures than in cases in which no implants were used. Illustrative examples of ions that can be employed in the present invention include, but are not limited to: halogens, including F, Br, and Cl, Si, H, Pt, Re, Rh, W, In and any combination thereof. Of the various ions mentioned above, it is highly preferred to use F ions.

The ions mentioned above are also capable of amorphizing or partially amorphizing the region implanted leading to both a modification in the diffusion properties and the perfect match of metal silicide with the Si-containing layer, thus preventing axiotaxy. A definition of axiotaxy can be found, for instance, in Nature, Vol. 426. p. 641 (2003).

Figure 3:
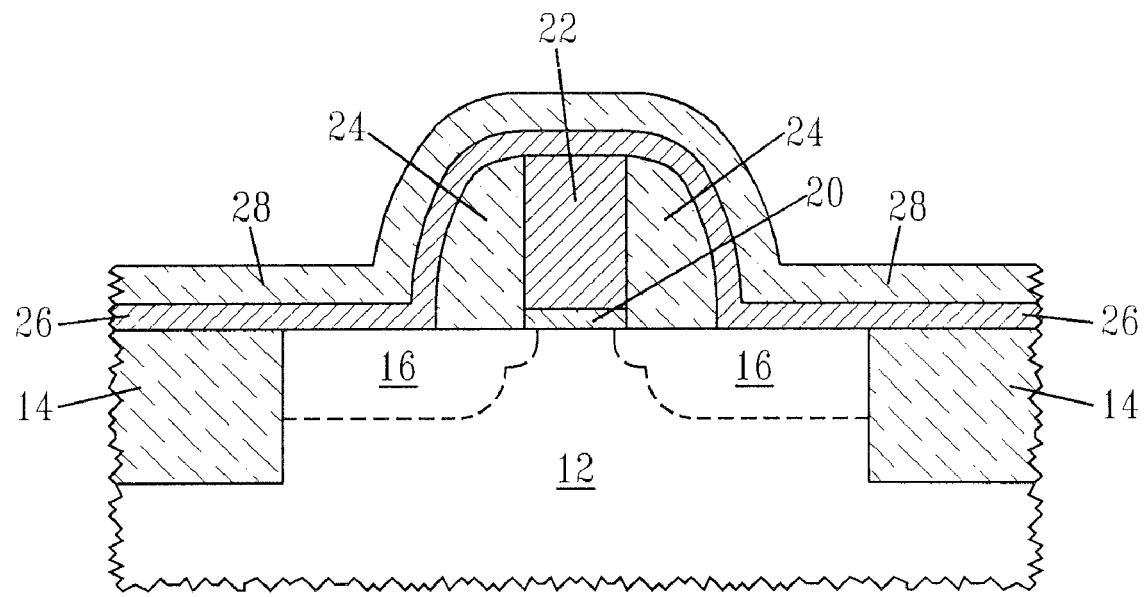
FIG. 3 is a pictorial representation (through a cross sectional view) illustrating the structure of FIG. 2 after formation of a metal layer and an optional cap layer.

After performing the above implantation of ions, a metal layer 26 and an optional cap layer 28 can be formed providing the structure shown, for example, in FIG. 3. As shown, the metal layer 26 is formed first and then, if used, the optional cap layer 28 is formed. The metal layer 26 is in contact with exposed portions of the Si-containing substrate 12, particularly, the metal layer 26 is contact with the exposed Si-containing substrate 12 at the source/drain diffusion regions 16.

The metal layer 26 may be deposited using a deposition process including, for example, chemical vapor deposition, physical vapor deposition, atomic layer deposition, electrodeposition and electroless deposition.

The metal layer 26 includes any silicide metal that tends to agglomerate during subsequent thermal cycles. Illustrative examples of such metals include: Ni, Pd, Pt, and W. In a highly preferred embodiment of the present invention, the metal layer 26 is comprised of Ni. When Ni is employed, it also highly preferred that F ions be implanted in the Si-containing substrate 12.

The metal layer 26 has a sufficient thickness that will allow for stabilized metal silicide contacts to be subsequently formed. Typically, the metal layer 26 has a thickness from about 2 to about 30 nm, with a thickness from about 5 to about 15 nm being more typical.

FIG. 3 also shows the presence of an optional cap 28 that is formed atop the metal layer 26. When present, the optional cap 28 is composed of a diffusion barrier material such as, for example, TiN, Ti, W and WN. The optional cap 28 is formed by a conventional deposition process, including, for example, sputtering, evaporation, chemical vapor deposition, chemical solution deposition and the like.

If used, the optional cap 28 has a thickness after deposition that is typically from about 5 to about 40 nm, with a thickness from about 5 to about 20 nm being more typical.

The structure shown in FIG. 3 is then subjected to a silicide annealing process in which a stabilized metal silicide contact is formed atop at least the source/drain diffusion regions 16. Note if the gate electrode material 22 is SiGe or polysilicon that does not include a hardmask, a metal silicide contact can be formed atop the gate electrode material 22 as well.

The annealing process employed in the present invention includes at least a first anneal and removal of optional cap 28 and any unreacted metal. An optional second anneal, which follows the removal step, may be required in some instances if the first anneal does not completely form a phase of the metal silicide having its lowest resistance.

The first anneal is typically performed at lower temperatures than the optional second annealing step. Typically, the first annealing step is performed at a temperature from about 200° C. to about 700° C. using a continuous heating regime or various ramp and soak heating cycles. More preferably, the first annealing step is performed at a temperature from about 250° C. to about 550° C. Typical annealing times for the first anneal are from about 1 to about 120 seconds. Longer anneal times, as high as about 1 hour, are also contemplated herein.

The first annealing step may form the lowest resistance phase of the metal silicide contact or it can form a metal rich silicide.

Figure 4:
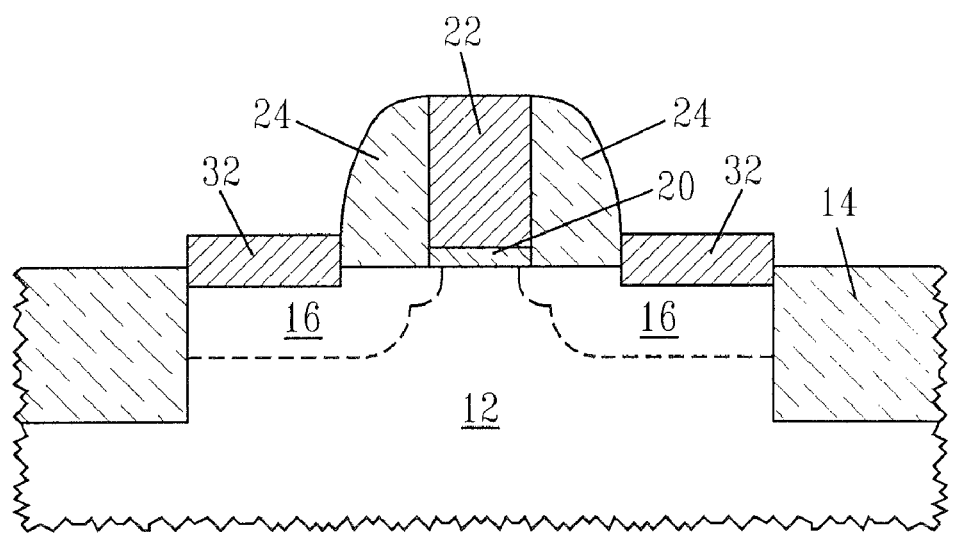
FIG. 4 is a pictorial representation (through a cross sectional view) illustrating the structure after annealing and removing of unreacted metal.

When needed, the second annealing step is performed at a temperature from about 250° C. to about 900° C. using a continuous heating regime or various ramp and soak heating cycles. More preferably, the second annealing step is performed at a temperature from about 350° C. to about 750° C. Typical annealing times for the second anneal are from about 1 to about 120 seconds. Longer anneal times, as high as 2 hours, are also contemplated herein. The second anneal typically converts the high resistance metal silicide or metal rich silicide phase into a metal silicide contact 32 of lower resistance. See FIG. 4.

The silicide anneals are carried out in a gas atmosphere, e.g., He, Ar, $N_2$ or forming gas. The silicide annealing steps may use different atmospheres or the annealing steps may be carried out in the same atmosphere. For example, He may be used in both annealing steps, or He can be used in the first annealing step and a forming gas may be used in the second annealing step.

The selective etching step includes any conventional etching process that can selectively remove non-reacted metal. Note that this etch also removes the optional cap 28. Examples include wet etching using a sulfuric acid/hydrogen peroxide solution. See FIG. 4. After performing the above steps, further CMOS processing steps for forming an inter-level dielectric containing conductively filled contact openings, which are in contact with the metal silicide contact 32 of the present invention, can be performed.

It is emphasized that the presence of the ions in the Si-containing substrate 12 substantially prevents agglomeration of the metal silicide during subsequent thermal processing. The presence of the ions blocks metal diffusion into the Si-containing substrate thereby effectively increasing the temperature at which agglomeration of the metal silicide may occur.

The following example illustrates the method of the present invention and shows that by performing the inventive processing steps a stabilized metal silicide film can be formed that exhibits substantially little or no agglomeration during subsequent high temperature thermal processing.

EXAMPLE

Figure 5A:
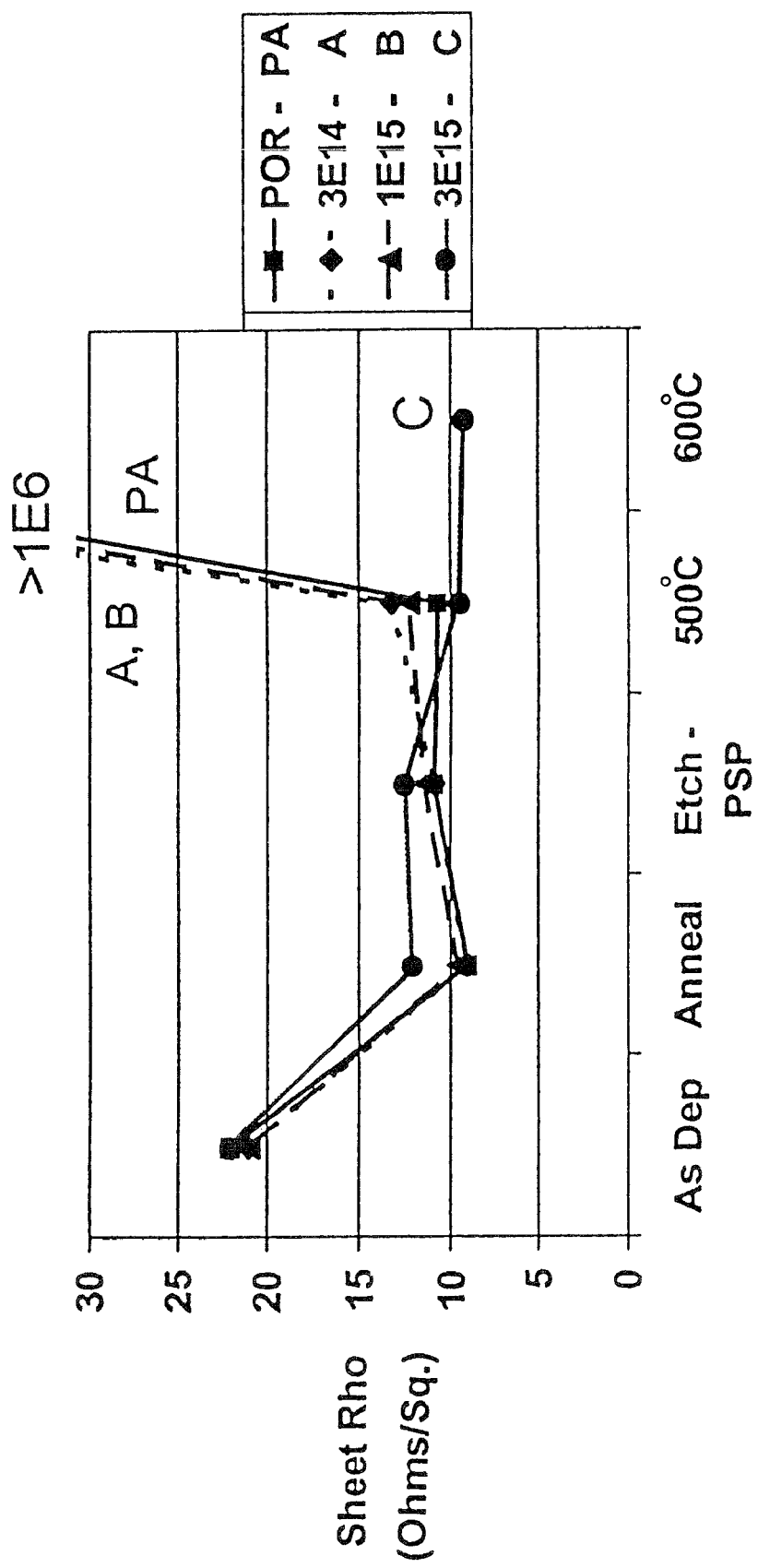
FIGS. 5A-5B are plots showing the sheet resistance variation of NiSi on a blanket SOI layer using $F^+$ implants. Specifically.
Figure 5B:
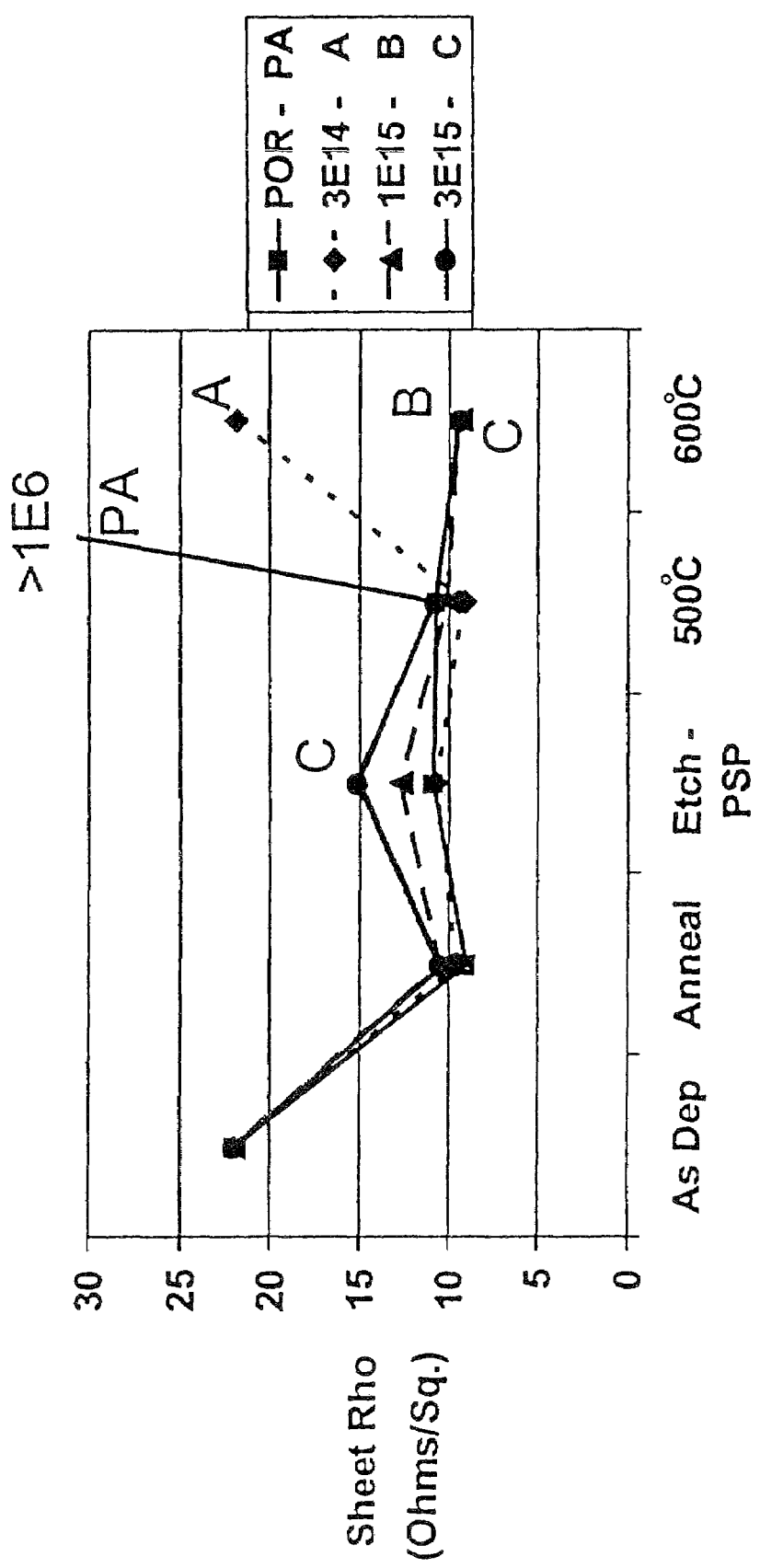
Figure 6A:
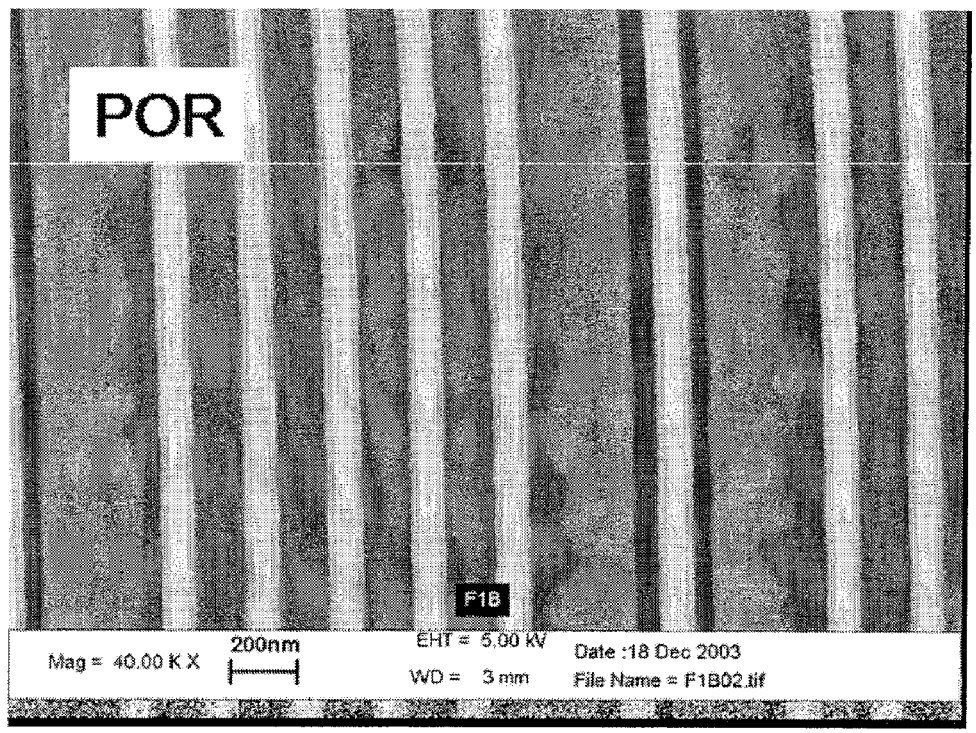
FIGS. 6A-6D are back-scattered SEMs of NiSi formed on a Si substrate.
Figure 6B:
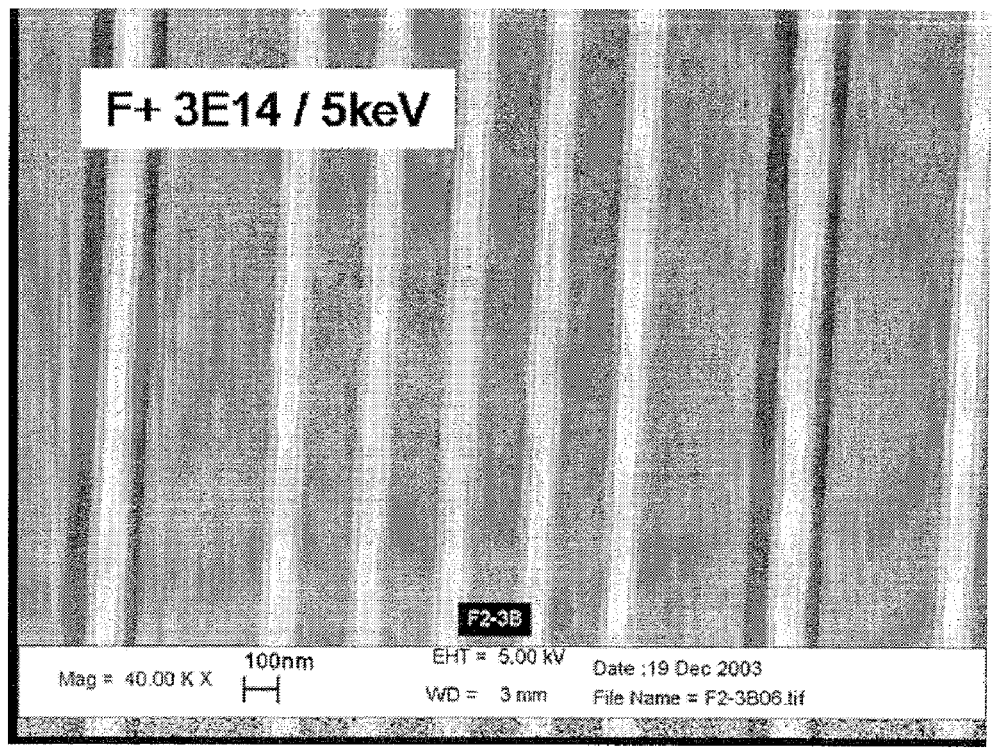
Figure 6C:
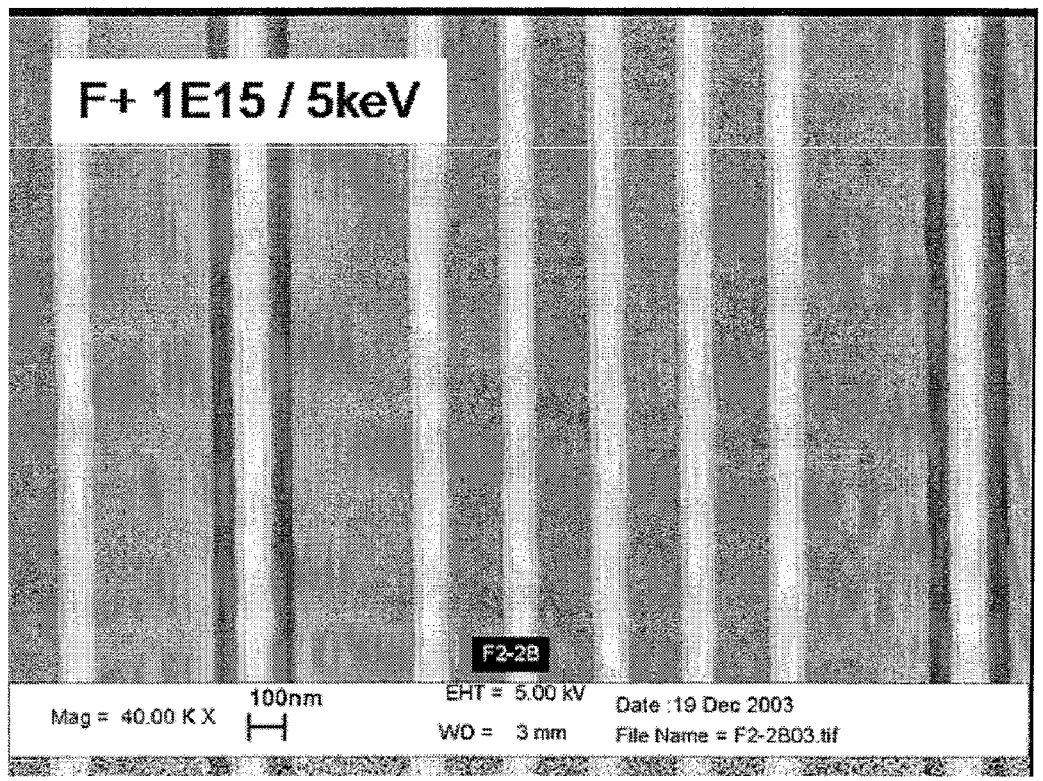
Figure 6D:
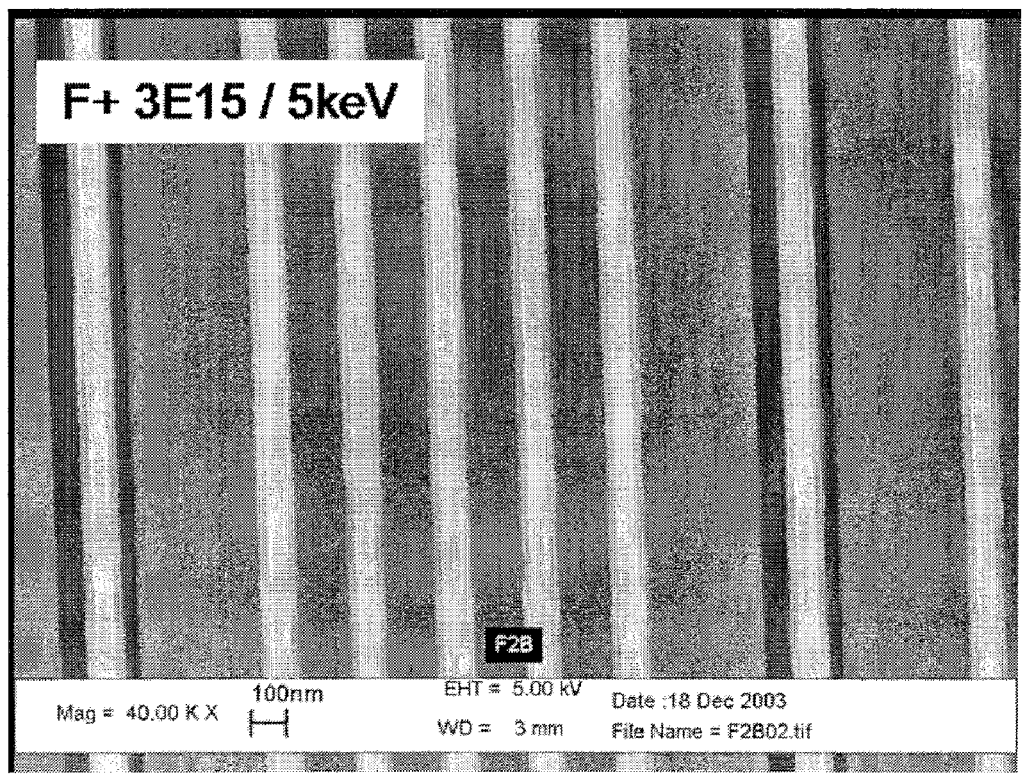

In this example, $F^+$ implants were performed on chips and on silicon-on-insulator (SOI) pieces before Ni (9 nm)/TiN deposition at either 2 keV or 5 keV. With these energies, most F+ implanted remains in the part of the Si that will be consumed to form the NiSi. At each of the energies, doses of 0.3, 1 and 3 E15 per $cm^2$ were selected. For one of the energy conditions, an extra activation anneal (35° C./0s to 1000° C., no hold) was performed to evaluate the effect of implantation of the F+ with other species (before activation anneal) or just before Ni deposition. The sheet resistance values of SOI samples after deposition, formation anneal, selective etch and anneals at 500° C. for 30 min and 600° C. for 30 min are shown in FIGS. 5A-5B. In FIG. 5A, results are given for 5 keV F+implants for which there was no extra activation anneal. In FIG. 5B, results are given when the activation anneal is performed before metal deposition. These results show that for a 600° C. anneal of 30 min:

a. The prior art NiSi film (labeled as PA) fully agglomerates (Rs>1E6 Ohms/sq.)

b. A dose of 3E14 without activation anneal (labeled as Curve A in FIG. 5A) is not sufficient to take full advantage and keep the lowest sheet resistance c. The activation anneal is not suitable (Rs>1E6) for doses of 3E14 and 1E15 (labeled as Curves A and B in FIG. 5B). This anneal was not detrimental in the case of the highest F+ dose (labeled as Curve C in FIG. 5B). The anneal drives the F away from the interface of interest but can still work if the dose is high enough. Implantation of F+ is more efficient just before metal deposition.

d. All samples that receive a dose of 3E15 maintained the low Rs of NiSi films (labeled as Curve C in FIGS. 5A and 5B).

e. Samples that receive a dose of 1E15 and No activation anneal also maintained low Rs (labeled as Curve 13 in FIG. 5A).

For one sample (3E15/2 keV not shown), the Rs was elevated after the selective etch. When the dose of F+ in the top Si layer was too large, the formation of NiSi was delayed significantly as the Rs is closer to that of metal rich phases.

Therefore doses ranging from 1 to 3E15 at energies ranging from 2 to 5 keV were most efficient at reducing agglomeration at 600° C. The delayed formation of NiSi at the higher dose and at the lower energy suggest that too high a dose may lead to other problems even if they resolve the agglomeration issue.

Stabilization of NiSi with F+ implants was also shown in narrow dimensions. The agglomeration of NiSi occurs primarily on narrow single crystal areas of chips. In FIGS. 6A-6D, the region of a test structure containing poly-Si and Si(100) areas are shown using back scattered SEM after anneals at 500° C. for 30 minutes (after NiSi formation, 20 nm thick).

The light lines correspond to NiSi on poly-Si while the darker regions bordering the lines are single crystal Si(100) areas. For the POR sample (prior art; no implants) shown in FIG. 6A, the NiSi on Si(100) areas is clearly agglomerated. Note that for the much narrower areas of NiSi on poly-Si, the NiSi retains its morphological properties. As the F+ dose (at 5 keV) is increased from 3E14 (FIG. 6B) to 5E15 (FIG. 6C), the NiSi on Si(100) is much more uniform, i.e., the agglomeration is significantly retarded. At the highest dose 3E15, 5 keV, the NiSi remains uniform. See FIG. 6D.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What we claim is:

1. A method for forming a stabilized NiSi film comprising:
implanting F ions to prevent agglomeration into a surface of a Si-containing layer at an implant energy of from about 1 to about 2 keV using a dose from about 3E14 to about 3E15 atoms/cm$^2$, said implanting F ions occurs after a standard device ion implantation and activation annealing process is performed;
annealing said F ions at a temperature from about 200° to about 1200° C. in an inert gas ambient;
forming a Ni layer atop the surface of the Si-containing layer containing said F ions; and
siliciding the Ni layer and the Si-containing layer containing said F ions to form a NiSi film having a sheet resistivity of less than about 25 Ohms/square at 600° C., said siliciding comprising a first anneal, removal of unreacted Ni, and a second anneal, where said first anneal is performed at a temperature from about 200° to about 700° C. and said second anneal is performed at a higher temperature than said first anneal, said higher temperature is in a range from about 250° to about 950° C.

* * * * *